United States Patent
Jung et al.

(10) Patent No.: US 7,494,935 B2
(45) Date of Patent: Feb. 24, 2009

(54) METHOD FOR FORMING FINE PATTERN OF SEMICONDUCTOR DEVICE

(75) Inventors: Jae Chang Jung, Seoul (KR); Seung Chan Moon, Seoul (KR); Cheol Kyu Bok, Icheon-si (KR); Myoung Ja Min, Icheon-si (KR); Keun Do Ban, Yongin-si (KR); Hee Youl Lim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 144 days.

(21) Appl. No.: 11/679,176

(22) Filed: Feb. 26, 2007

(65) Prior Publication Data
US 2008/0063985 A1   Mar. 13, 2008

(30) Foreign Application Priority Data
Sep. 12, 2006   (KR) ............... 10-2006-0087855

(51) Int. Cl.
*H01L 21/302* (2006.01)
*H01L 21/461* (2006.01)
(52) U.S. Cl. ............... 438/725; 438/708; 257/E21.302
(58) Field of Classification Search ............... 438/725, 438/708
See application file for complete search history.

(56) References Cited

U.S. PATENT DOCUMENTS

| | | | | |
|---|---|---|---|---|
| 4,961,820 A | * | 10/1990 | Shinagawa et al. | 438/725 |
| 2005/0056913 A1 | * | 3/2005 | Farnworth | 438/725 |
| 2007/0042298 A1 | * | 2/2007 | Jung et al. | 430/311 |

FOREIGN PATENT DOCUMENTS

| KR | 10-2002-0000351 A | 1/2002 |
|---|---|---|
| KR | 10-2002-0061479 A | 7/2002 |
| KR | 10-2006-0032301 A | 4/2006 |
| KR | 10-2006-0084051 A | 7/2006 |

* cited by examiner

*Primary Examiner*—Phat X Cao
*Assistant Examiner*—Nga Doan
(74) *Attorney, Agent, or Firm*—Townsend and Townsend and Crew LLP

(57) ABSTRACT

A method for forming a fine pattern of a semiconductor device includes forming a first photoresist film pattern over a semiconductor substrate including an underlying layer, exposing the first photoresist film pattern to generate an acid from the first photoresist film pattern, bleaching the first photoresist film pattern, and forming a second photoresist film pattern between the first photoresist patterns.

20 Claims, 3 Drawing Sheets

METHOD FOR FORMING FINE PATTERN OF SEMICONDUCTOR DEVICE

CROSS-REFERENCES TO RELATED APPLICATIONS

The present application claims priority to Korean patent application number 10-2006-0087855, filed on Sep. 12, 2006, which is incorporated by reference in its entirety.

BACKGROUND OF THE INVENTION

The present invention relates to a manufacturing method for a semiconductor memory device, and more particularly, to a method for forming a fine pattern in a semiconductor device.

According to a general method for forming a fine pattern of a semiconductor device, an underlying layer is formed over a semiconductor substrate. The underlying layer may be an insulating layer, a polysilicon layer, or a metal layer. A photoresist film is coated over the underlying layer. The photoresist film is exposed and developed with an exposure mask to form a photoresist film pattern. The photoresist film pattern is formed with a minimum pitch and a minimum line-width which can be formed by a current lithography process. In line/space patterns, the minimum pitch includes the pattern and the space with the equal width (1F). The underlying layer is etched using the photoresist film pattern as an etching mask to form an underlying layer pattern. The photoresist film pattern is removed to form a fine underlying layer pattern.

However, it is difficult to obtain high integration in semiconductor devices due to resolution limits in the current lithography process. As a result, there is a need to development equipment which can overcome resolution limits without much cost.

BRIEF SUMMARY OF THE INVENTION

Various embodiments of the present invention are directed at providing an improved method for forming a fine pattern using a double exposure technology.

According to an embodiment of the present invention, a method for forming a fine pattern of a semiconductor device comprises the steps of: forming a first photoresist film pattern over a semiconductor substrate including an underlying layer; exposing the first photoresist film pattern to generate an acid from the first photoresist film pattern; bleaching the first photoresist film pattern to neutralize the acid; and forming a second photoresist film pattern between the first photoresist film patterns.

The exposure process of the first photoresist film pattern is performed with an exposure energy ranging from about 30 mJ/cm$^2$ to about 200 mJ/cm$^2$, preferably, ranging from about 80 mJ/cm$^2$ to about 120 mJ/cm$^2$. The bleaching process of the first photoresist film pattern is performed using a basic material with one selected from the group consisting of triethyl amine, Hex Methyl Di-Silane (HMDS), ammonia, methyl amine and combinations thereof. The bleaching process is performed by a wet method. The bleaching process includes precipitating the semiconductor substrate including the first photoresist film pattern in a bleaching solution for 50~70 seconds, and spin-dehydrating the semiconductor substrate. The bleaching process is performed by a dry method. The dry bleaching process is performed spraying a bleaching material over the semiconductor substrate at a temperature of 60° C. or less. The formation of the second photoresist film pattern includes coating a second photoresist film over the semiconductor substrate including the first photoresist film pattern, and exposing and developing the second photoresist film with the second exposure mask to form a second photoresist film pattern between the first photoresist patterns. The second photoresist film includes $C_4$-$C_8$ alcohol as a solvent. The solvent is selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methyl-pentanol, 3-methylpentanol, 4-methylpentanol, 1,3-dimethylbutanol, 1,2-dimethylbutanol, heptanol, octanol and combinations thereof. The second exposure mask is the same as the first exposure mask for forming a first photoresist film pattern, or an additional exposure mask. The pitch of the first photoresist film pattern or the second photoresist film pattern is 'a' and the pitch between the first photoresist film pattern and the second photoresist film pattern is 'a/2'. Additionally, a hard mask layer and an anti-reflection film are formed at the interface between the first photoresist film pattern and the semiconductor substrate.

In one embodiment, a method for forming a pattern for a semiconductor device includes providing a semiconductor substrate including an underlying layer. A first photoresist pattern is formed over the underlying layer. The first photoresist pattern is light exposed to generate acid from the first photoresist pattern. The first photoresist pattern is beached to make the first photoresist pattern non-reactive to light exposure. A second photoresist film is formed over the underlying layer and the first photoresist pattern that has been made non-reactive to the light exposure. The second photoresist film is light exposed to form a second photoresist pattern, so that the first and second photoresist patterns are provided over the underlying layer. The underlying layer may be the substrate or a layer provided over the substrate.

In another embodiment, a method for forming a pattern over a substrate includes providing the substrate including an underlying layer. A first pattern is formed over the underlying layer, the first pattern configured to chemically react when exposed to light, the first pattern having a plurality of first structures having a pitch. The first pattern is converted to a second pattern that does not chemically react when exposed to light, the second pattern having a plurality of second structures having the same pitch as the first structures. A film is formed over the second pattern and the underlying layer, the film configured to chemically react when exposed to light. The film is light exposed to form a third pattern having a plurality of third structures having a pitch, so that the second and third patterns are provided over the underlying layer. The second and third patterns are transferred to the underlying layer.

In yet another embodiment, the second structures and the third structures are provided in an alternating arrangement. The first pattern and the second pattern are photoresist patterns, and the second pattern is the first pattern that has been beached to be non-reactive to light exposure. The underlying layer is the substrate or a layer overlying the substrate. The first, second, and third structures have substantially the same pitch.

DESCRIPTION OF SPECIFIC EMBODIMENTS

The present invention relates to a method for forming a fine pattern in a semiconductor device. The fine pattern is produced by using two separate lithography processes to produce one mask. Each process produces a pattern with a resolution equal to the conventional method, but combined they can produce a pattern beyond the limits of the conventional method.

More specifically, a first photoresist film pattern (or first photoresist pattern) is formed over a semiconductor substrate including an underlying layer. The first photoresist film pattern is exposed to generate an acid, which changes the solubility of the photoresist in the exposed areas. A bleaching process is performed on the first photoresist film pattern where the acid is generated to make the first photoresist pattern insensitive to light. The bleaching process reduces the activity of a Photo Active Generator (PAG) by neutralizing the reaction using a basic material.

As used herein, the "underlying layer" refers to a layer or material that is provided below the first photoresist film. The underlying layer may be an insulating layer, a conductive layer, or even the semiconductor substrate itself. For illustrative purposes, however, the underlying layer may be described as a layer underlying the first photoresist pattern and over the substrate.

A second photoresist film is coated over the semiconductor substrate. The second photoresist film is exposed and developed to form a second photoresist film pattern (or second photoresist pattern) between the first photoresist film patterns. In one embodiment of the present invention, the bleaching process for the first photoresist film pattern prevents the first photoresist film pattern from being removed in the exposure and developing process for forming a second photoresist film pattern.

Figure 1A:
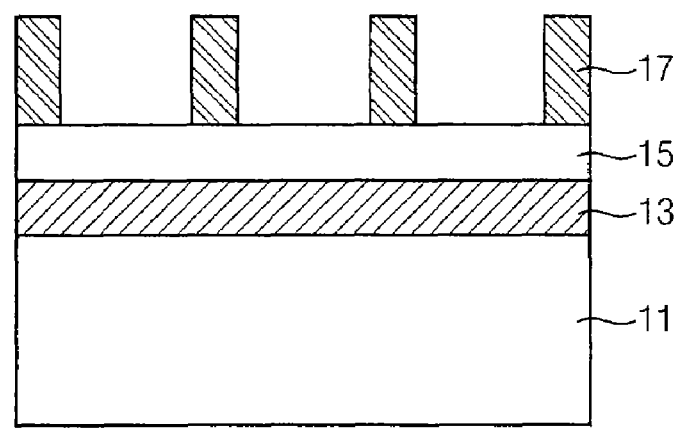
FIGS. 1a through 1e are cross-sectional views illustrating a method for forming a fine pattern in a semiconductor device according to an embodiment of the present invention.
Figure 1B:
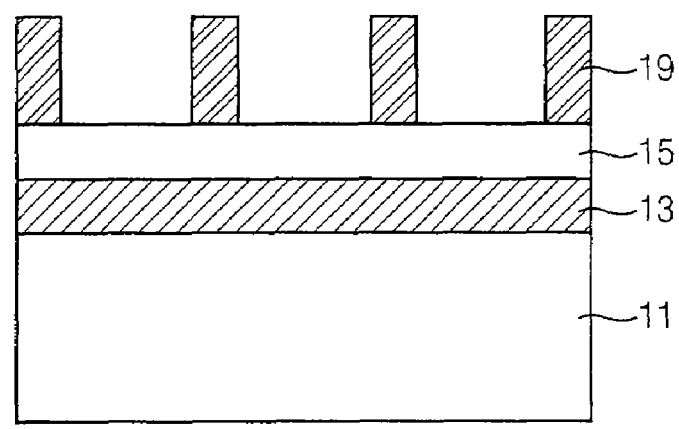
Figure 1C:
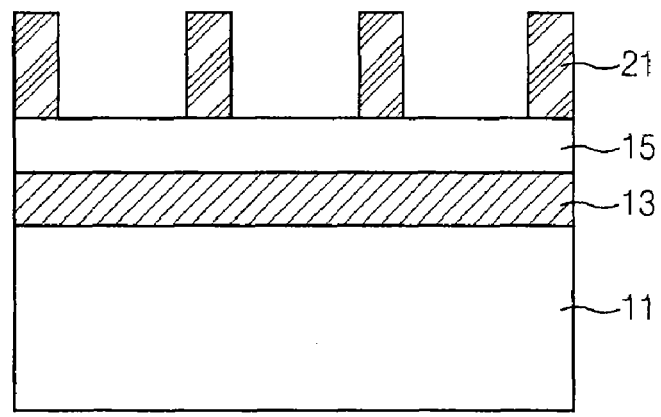
Figure 1D:
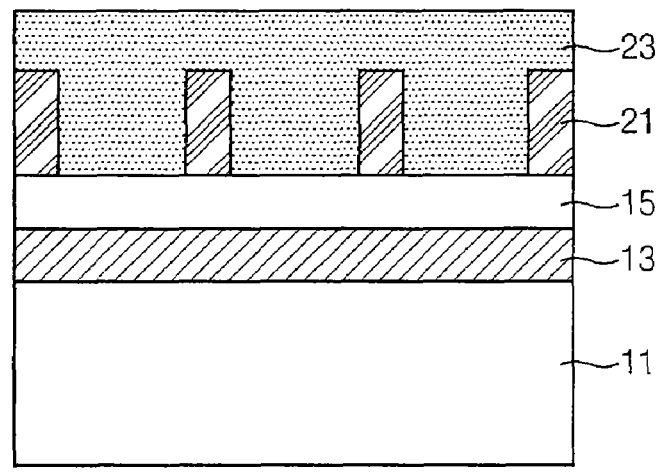
Figure 1E:
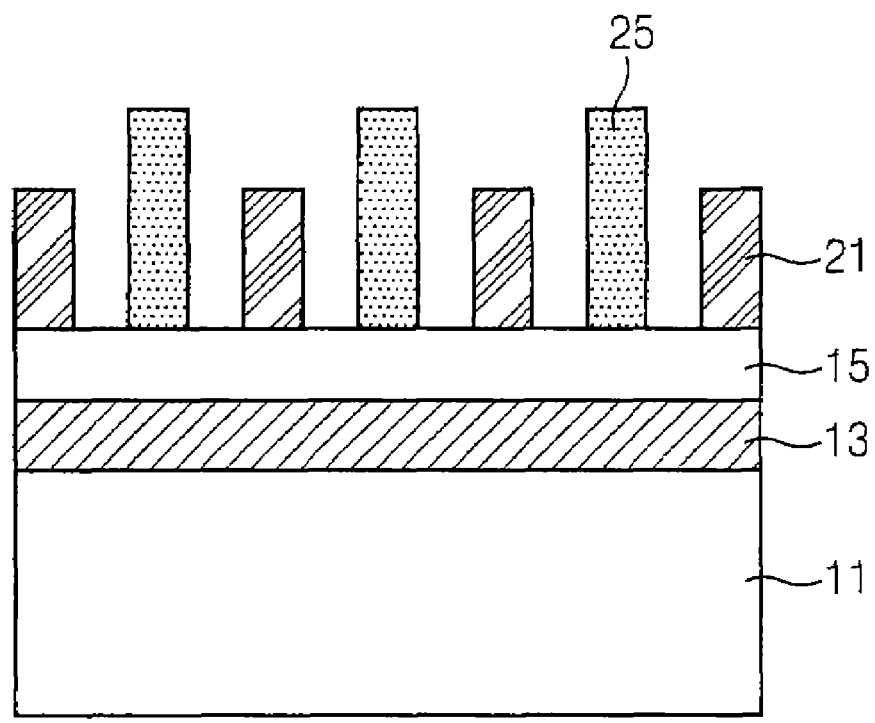

FIGS. 1a through 1e are cross-sectional views illustrating a method for forming a fine pattern of a semiconductor device according to an embodiment of the present invention. A hard mask layer 13 is formed over a semiconductor substrate 11 comprising an underlying layer including a given lower structure. An anti-reflection film 15 is formed over the hard mask layer 13. A first photoresist film (not shown) is coated over the anti-reflection film 15. The first photoresist film is exposed and developed with a first exposure mask (not shown) to form a first photoresist film pattern 17. The first exposure mask has a line/space pattern.

The first photoresist pattern 17 is exposed to form a first photoresist film pattern 19 having an acid. A bleaching process is performed on the first photoresist film pattern 19 using a basic material with one selected from the group consisting of triethyl amine, Hex Methyl Di-Silane (HMDS), ammonia, methyl amine and combinations thereof. The exposure process for the first photoresist film pattern 17 is performed with an exposure energy ranging from about 30 $mJ/cm^2$ to about 200 $mJ/cm^2$, preferably, ranging from about 80 $mJ/cm^2$ to about 120 $mJ/cm^2$. Meanwhile, the exposure energy can be adjusted depending on the type of photoresist film and the concentration of the acid by a person skilled in the art.

According to one embodiment of the present invention, the bleaching process of the first photoresist film pattern 19 is performed by a wet method. In the wet bleaching process, the semiconductor substrate 11 including the first photoresist film pattern 19 is precipitated in a bleaching solution for about 50~70 seconds. The semiconductor substrate 11 is dehydrated using a spin dry. Otherwise, the bleaching process can be performed by a dry method. The dry bleaching process is performed at a temperature of 60° C. or less by spraying a bleaching material over the semiconductor substrate 11. With the bleaching process, the first photoresist film pattern 19 is converted to a first photoresist film pattern 21 that is made "insensitive" or chemically non-reactive to light exposure.

A second photoresist film 23 is coated over the semiconductor substrate 11 and the first photoresist film pattern 21. The second photoresist film 23 is exposed and developed with a second exposure mask (not shown) to form a second photoresist film pattern 25 between the first photoresist film patterns 21. Since the first photoresist film pattern 21 does not chemically react to the light exposure, the first photoresist film pattern 21 is not developed during the developing process for the second photoresist film 23 and remains between the second photoresist film patterns 25.

The second photoresist film 23 includes a solvent that does not dissolve the first photoresist film pattern in the exposure and developing process. The second photoresist film 23 is selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methyl-pentanol, 3-methylpentanol, 4-methylpentanol, 1,3-dimethylbutanol, 1,2-dimethylbutanol, heptanol, octanol and combinations thereof. The second photoresist film 23 includes $C_4$-$C_8$ alcohol as a solvent. The second exposure mask is designed to form the second photoresist film pattern 25 between the first photoresist film patterns 21. The second exposure mask can make use of the first exposure mask by shifting it a given distance. Otherwise, an additional exposure mask can be fabricated. The first photoresist film pattern and the second photoresist film pattern each have a minimum pitch. However, the pitch between the first photoresist film pattern and the second photoresist film pattern is less than the minimum pitch, e.g., ½ of the minimum pitch.

According to one embodiment of the present invention, the processes shown in FIGS. 1a through 1e are repeated two or more times to form two or more patterns in a given pitch.

As described above, in a method for forming a fine pattern of a semiconductor device according to an embodiment of the present invention, a fine pattern that can overcome limits of the lithography process is formed to improve yield of high integrated devices.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the spirit and scope of the appended claims.

What is claimed is:

1. A method for forming a pattern for a semiconductor device, the method comprising:

providing a semiconductor substrate including an underlying layer;

forming a first photoresist pattern over the underlying layer;

light exposing the first photoresist pattern to generate acid from the first photoresist pattern;

bleaching the first photoresist pattern to make the first photoresist pattern non-reactive to light exposure;

forming a second photoresist film over the underlying layer and the first photoresist pattern that has been made non-reactive to the light exposure;

light exposing the second photoresist film to form a second photoresist pattern, so that the first and second photoresist patterns are provided over the underlying layer.

2. The method according to claim 1, wherein the light exposure step for the first photoresist pattern is performed with an exposure energy ranging from about 30 mJ/cm$^2$ to about 200 mJ/cm$^2$.

3. The method according to claim 1, wherein the light exposure for the first photoresist pattern is performed with an exposure energy ranging from about 80 mJ/cm$^2$ to about 120 mJ/cm$^2$.

4. The method according to claim 1, wherein the bleaching process for the first photoresist pattern is performed using a basic material with one selected from the group consisting of triethyl amine, Hex Methyl Di-Silane (HMDS), ammonia, methyl amine and combinations thereof.

5. The method according to claim 1, wherein the bleaching process involves a wet method.

6. The method according to claim 5, wherein the bleaching process comprises:
   inserting the semiconductor substrate including the first photoresist pattern in a bleaching solution for about 50~70 seconds; and
   spin-dehydrating the semiconductor substrate.

7. The method according to claim 1, wherein the bleaching process involves a dry method.

8. The method according to claim 7, wherein the dry bleaching process is performed by spraying a bleaching material over the semiconductor substrate at a temperature of about 60° C. or less.

9. The method according to claim 1, wherein the first photoresist pattern includes a plurality of structures and the second photoresist pattern includes a plurality of structures, wherein the structures of the first photoresist pattern are interweaved with the structures of the second photoresist pattern.

10. The method according to claim 9, wherein the second photoresist film includes $C_4$-$C_8$ alcohol as a solvent.

11. The method according to claim 10, wherein the solvent is selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methyl-pentanol, 3-methylpentanol, 4-methylpentanol, 1,3-dimethylbutanol, 1,2-dimethylbutanol, heptanol, octanol and combinations thereof.

12. The method according to claim 9, wherein the structures of the first photoresist pattern have a first pitch, and the structures of the second photoresist pattern have substantially the first pitch.

13. The method according to claim 12, wherein the structures of the first and second photoresist patterns together define a second pitch that is less than the first pitch, wherein the second pitch about ½ of the first pitch.

14. The method according to claim 1, further comprising a hard mask layer and an anti-reflection film at the interface between the first photoresist pattern and the semiconductor substrate.

15. The method according to claim 1, wherein the underlying layer is the semiconductor substrate.

16. A method for forming a pattern over a substrate, the method comprising:
   providing the substrate including an underlying layer;
   forming a first pattern over the underlying layer, the first pattern configured to chemically react when exposed to light, the first pattern having a plurality of first structures having a pitch;
   converting the first pattern to a second pattern that does not chemically react when exposed to light, the second pattern having a plurality of second structures having the same pitch as the first structures;
   forming a film over the second pattern and the underlying layer, the film configured to chemically react when exposed to light;
   light exposing the film to form a third pattern having a plurality of third structures having a pitch, so that the second and third patterns are provided over the underlying layer; and
   transferring the second and third patterns to the underlying layer.

17. The method of claim 16, wherein the second structures and the third structures are provided in an alternating arrangement.

18. The method of claim 16, wherein the first pattern and the second pattern are photoresist patterns, and the second pattern is the first pattern that has been bleached to be non-reactive to light exposure.

19. The method of claim 16, wherein the underlying layer is the substrate.

20. The method of claim 16, wherein the first, second, and third structures have substantially the same pitch.

* * * * *